(12) United States Patent
Chen et al.

(10) Patent No.: US 11,776,810 B2
(45) Date of Patent: Oct. 3, 2023

(54) METHOD OF FORMING A SEMICONDUCTOR DEVICE

(71) Applicant: Taiwan Semiconductor Manufacturing Co., Ltd., Hsinchu (TW)

(72) Inventors: Chia-Cheng Chen, Hsinchu (TW); Chun-Hung Wu, New Taipei (TW); Liang-Yin Chen, Hsinchu (TW); Huicheng Chang, Tainan (TW); Yee-Chia Yeo, Hsinchu (TW); Chun-Yen Chang, Hsinchu (TW); Chih-Kai Yang, Taipei (TW); Yu-Tien Shen, Tainan (TW); Ya Hui Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 17/463,000

(22) Filed: Aug. 31, 2021

(65) Prior Publication Data

US 2023/0061485 A1 Mar. 2, 2023

(51) Int. Cl.
*H01L 21/027* (2006.01)
*H01L 21/768* (2006.01)
*H01L 21/311* (2006.01)

(52) U.S. Cl.
CPC .... *H01L 21/0274* (2013.01); *H01L 21/31116* (2013.01); *H01L 21/31144* (2013.01); *H01L 21/76802* (2013.01)

(58) Field of Classification Search
None
See application file for complete search history.

(56) References Cited

U.S. PATENT DOCUMENTS

| 7,064,078 B2 | 6/2006 | Liu et al. |
| 9,304,396 B2 | 4/2016 | Shamma et al. |
| 2022/0069204 A1* | 3/2022 | Ko ....................... H10N 70/021 |

OTHER PUBLICATIONS

DeSimone et al., "Demonstration of an N7 integrated fab process for metal oxide EUV photoresist", Proceedings of SPIE, SPIE Advanced Lithgraphy, Mar. 18, 2016, 10 pages, San Jose, California, United States.
Shibashi, T. et al., "Novel Spin-on Carbon Hard Mask with Hardening by Ion Implantation", May 21, 2007, 8 pages, Journal of Phtopolymer Science and Technology, vol. 20, No. 3.
Miao, M. et al., "Patterning with metal-oxice EUV photoresist: patterning capability, resist smoothing, trimming, and selective stripping", Proceedings of SPIE, Mar. 27, 2017, 10 pages, San Jose, California, United States.
Seih, J. et al., "Lithographic application of diamond-like carbon films", Thin Solid Films 254 (1995), Jun. 21, 1994, 4 pages.

* cited by examiner

*Primary Examiner* — Roberts P Culbert
(74) *Attorney, Agent, or Firm* — Slater Matsil, LLP

(57) ABSTRACT

A method for forming a semiconductor device is provided. In some embodiments, the method includes forming a target layer over a semiconductor substrate, forming a carbon-rich hard masking layer over the target layer, patterning features in the carbon-rich hard masking layer using an etching process, performing a directional ion beam trimming process on the features patterned in the carbon-rich hard masking layer, and patterning the target layer using the carbon-rich hard masking layer as a mask.

20 Claims, 13 Drawing Sheets

METHOD OF FORMING A SEMICONDUCTOR DEVICE

BACKGROUND

With the increasing down-scaling of semiconductor devices, various processing techniques (e.g., photolithography) are adapted to allow for the manufacture of devices with increasingly smaller dimensions. For example, as the density of gates increases, the manufacturing processes of various features in the device (e.g., overlying interconnect features) are adapted to be compatible with the down-scaling of device features as a whole. However, as semiconductor processes have increasingly smaller process windows, there is an increasing need to form more exact patterning layers that match theoretical design criterion to reduce edge placement errors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
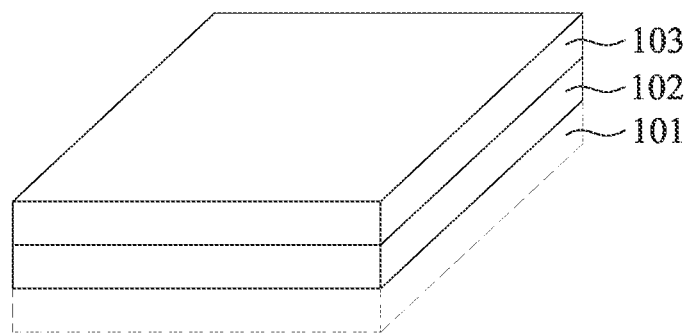
FIGS. 1A-6C and 9A-11B illustrate plan, cross-sectional, and 3D views of the fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, the present disclosure is a method including a directional ion beam trimming process in a lithography and etching process. The directional ion beam trimming process enables the formation of square shapes in line-end structures. These improved shapes for line-end structures improves edge placement error for patterning related to process windows. Thus, non-uniformity and distribution of line-end critical distances can be significantly improved. Further, in some cases, up to at least a 76% reduction in instances of line-end bridge defects (break through between adjacent etched features) have been realized. Additionally, non-uniformity and distribution of line-end bridge defects may also be improved.

In some embodiments, the directional ion beam trimming process is performed on a carbon-rich material. Specifically, in some embodiments, the carbon-rich material comprises a carbon content between 50% and 100% by atomic weight, and the directional ion beam trimming process may cause hardening of the carbon-rich material. The associated hardening results in a reduced etching rate in the carbon-rich material, which allows for a higher degree of control during the directional ion beam trimming process, and increased ability to maintain critical dimensions within process tolerances.

FIGS. 3A through 6C and 9A through 10C illustrate perspective views, cross-sectional views and/or plan views of intermediate stages in the patterning of features in a semiconductor device, in accordance with some exemplary embodiments. These figure numbers are followed by a letter "A," "B," or "C," where the letter "A" indicates that the respective view is a perspective view, the letter "B" indicates that the respective view is a plan view (a top view), and the letter "C" indicates that the respective view is a cross-sectional view along the line A-A' in the respective plan view. For example, FIG. 3C illustrates the reference cross-section A-A' in FIG. 3B FIGS. 1A through 6C and 10A through 11B illustrate intermediate stages in the formation of patterned openings in a target layer 102 and forming metal lines within the patterns, in accordance with some exemplary embodiments. The example patterning process shown in FIGS. 1A-6C uses a photolithographic patterning process combined with a directional ion beam etching process 110 to pattern a carbon-rich hard masking layer 103. In some embodiments, conductive material 130 is then formed in the patterned areas created through the processes described below in the target layer 102. The embodiments described in FIGS. 1A through 6C and 10A through 11B are presented in the context of using a single photolithographic patterning process to form openings in the target layer 102, but in other embodiments, two or more photolithographic patterning processes (i.e., multi-patterning) may be used. In some cases, multi-patterning processes may allow for a smaller pitch of patterned features. Other photolithographic techniques, including additional or different steps, may be used to pattern the carbon-rich hard masking layer 103, and are within the scope of this disclosure.

Figure 1B:

As shown in FIGS. 1A and 1B, the semiconductor device includes at least a substrate 101, a target layer 102, and a carbon-rich hard masking layer 103.

Although FIGS. 1A-B illustrate the target layer 102 being in physical contact with substrate 101, any number of intervening layers may be disposed between target layer 102 and substrate 101. Such intervening layers may include inter-metal dielectric (IMD) layers or dielectric layers, and may have contact plugs, conductive lines, and/or vias formed therein, or may include one or more intermediary layers (e.g., etch stop layers, adhesion layers, etc.), combinations thereof, and the like. The substrate 101 is omitted from later figures.

For example, an optional etch stop layer (not illustrated) may be disposed directly under the target layer 102. The etch stop layer may, for example, act as a stop for an etching process subsequently performed on the target layer 102. The material and process(es) used to form the etch stop layer may depend on the material of the target layer 102. In some embodiments, the etch stop layer may be formed of SiN, SiON, SiCON, SiC, SiOC, SiCN, SiO, other dielectrics, the like, or combinations thereof. The etch stop layer may be formed by plasma enhanced chemical vapor deposition (PECVD), low pressure CVD (LPCVD), plasma vapor deposition (PVD), or the like. Other materials and processes may be used.

The substrate 101 may be formed of a semiconductor material such as silicon, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as planar transistors, FinFETs, other types of transistors, diodes, capacitors, resistors, etc., may be formed in and/or on an active surface of substrate 101. For example, in some embodiments, the target layer 102 may be an IMD layer formed over the fins, metal gates, or source/drain regions of one or more FinFETs formed in the substrate 101.

The target layer 102 is a layer in which a pattern is to be formed in accordance with embodiments of the present disclosure. In some embodiments, conductive lines may be formed in the patterned areas of the target layer 102 as part of a metallization structure or an interconnect structure of a semiconductor device, and may be formed of a metal, as described further below. For example, the conductive lines formed using the techniques described herein may be used to form conductive interconnects as part of a Back End of Line (BEOL) process or a Front End of Line (FEOL) process. In some embodiments, semiconductor device is processed as part of a larger wafer. In such embodiments, after various features of the semiconductor device is formed (e.g., active devices, interconnect structures, and the like), a singulation process may be applied to scribe line regions of the wafer in order to separate individual semiconductor dies from the wafer (also referred to as singulation).

In some embodiments, the target layer 102 may be formed over a substrate 101. In some embodiments, the target layer 102 may be an inter-layer dielectric (ILD) layer formed over source/drain regions or the gate of a transistor (e.g., a FinFET), a dielectric layer in an interconnect structure, or a dielectric layer used in other types of metallization structures. In some embodiments, the target layer 102 may be formed of a dielectric material, for example, a nitride material such as silicon nitride (SiN), an oxide material such as silicon oxide (SiO), TEOS, BPTEOS, or the like. The target layer 102 may also be a low-k dielectric material, a polymer material, another dielectric material, the like, or combinations thereof. The target layer 102 may be formed by plasma enhanced chemical vapor deposition (PECVD), low pressure CVD (LPCVD), plasma vapor deposition (PVD), or the like. In some embodiments the target layer 102 may be a portion of the substrate 101 in which features are created for forming FinFETs. NanoFETS, and the like.

In some embodiments, the conductive lines are formed in a dielectric layer such as an inter-metal dielectric (IMD) layer that forms the bulk of the target layer 102. In some embodiments, openings may be patterned in the target layer 102 with the embodiment processes, and conductive lines may be formed in the openings as described below with regard to FIGS. 1A through 6C and 9A through 11B.

A carbon-rich hard masking layer 103 is formed over the target layer 102. The carbon-rich hard masking layer 103 may be formed of spin-on carbon (SOC), amorphous carbon (APF), or diamond-like carbon (DLC). The carbon-rich hard masking layer 103 may be formed using a process such as CVD, plasma enhanced CVD (PECVD), high density plasma CVD (HDPCVD), or the like. In some embodiments, a material composition of the carbon-rich hard masking layer 103 may comprise a carbon content between 50% and 100% by atomic weight. In some embodiments, the carbon-rich hard masking layer 103 may include more than one layer and include more than one material. In some embodiments, the carbon-rich hard masking layer 103 has a thickness between about between about 1 nm and about 10 nm, though in other embodiments the carbon-rich hard masking layer 103 may have another thickness.

Figure 2A:
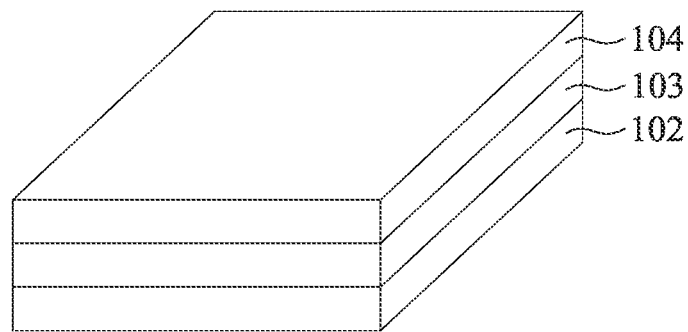
Figure 2B:
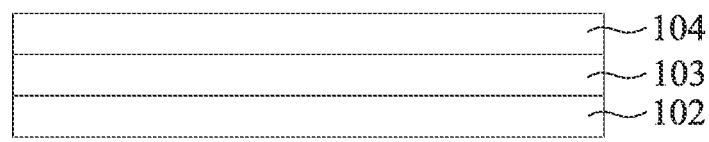

As shown in FIGS. 2A-2B, a photoresist structure 104 is then formed over the carbon-rich hard masking layer 103 which comprises at least a photoresist layer. The photoresist layer may be a photosensitive material, which includes organic materials, and may be a positive photosensitive material or a negative photosensitive material. The photoresist may also comprise a metal-oxide material, such as tin-oxide, suitable for patterning small pitches and feature sizes. The photoresist structure 104 may have a thickness between about between about 1 nm and about 30 nm, though in other embodiments the photoresist structure may have another thickness.

The photoresist structure 104 shown in FIGS. 2A-B may include additional layers such as an anti-reflection coating (ARC) (not shown) formed over the protective mask layer (not shown). In some embodiments, the photoresist structure may include an additional layer disposed between an ARC layer and a photoresist layer, forming a tri-layer structure. The ARC may be a material such as silicon oxide, silicon nitride, silicon oxynitride, a polymer, the like, or a combination.

Figure 3A:
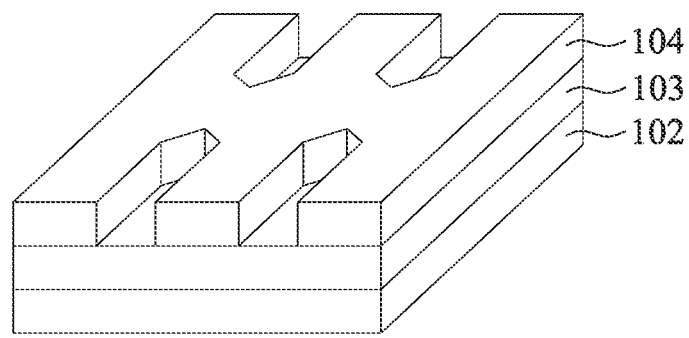
Figure 3B:
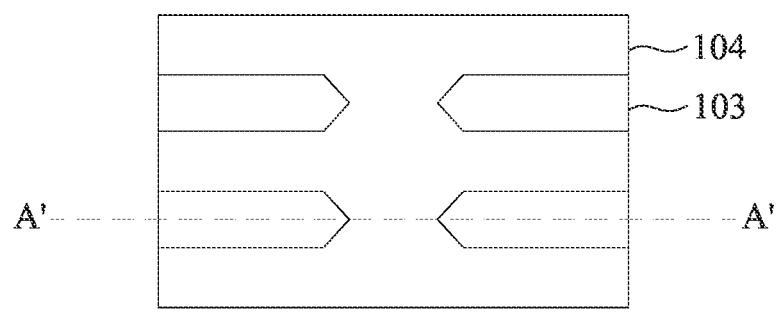
Figure 3C:
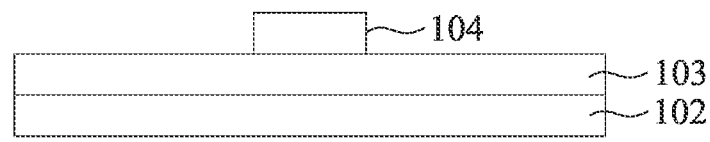

As shown in FIGS. 3A-3C, the photoresist structure 104 is patterned (e.g., using a photolithographic process), forming openings. In embodiments where the photoresist structure 104 includes an ARC, the carbon-rich hard masking layer 103 may not be directly exposed by the openings. In some embodiments, the openings also extend through the ARC. In other embodiments, for example, where an ARC layer is not included, the portions of the carbon-rich hard masking layer 103 may be exposed by the openings in the photoresist structure 104 formed in the photolithographic process. The photoresist structure 104 may be patterned using any suitable photolithography process to form openings therein. For example, the photoresist structure 104 may be patterned using extreme ultraviolet (EUV) lithography techniques. In FIGS. 3A and 3B, the end shape of the features in the photoresist structure 104 are shown as triangular. This shape is not intended to be limiting and is merely used to show that the result from the etching process is an end feature that is not substantially squared off (e.g., have corners that are 90°±10°). In practice, the end features may be concave, convex, or a rounded triangle depending on the etching process used.

Figure 4A:
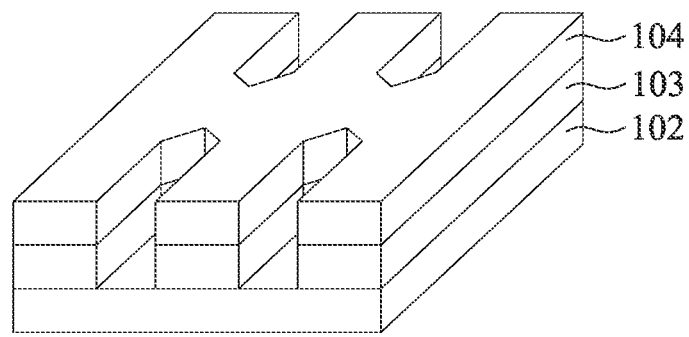
Figure 4B:
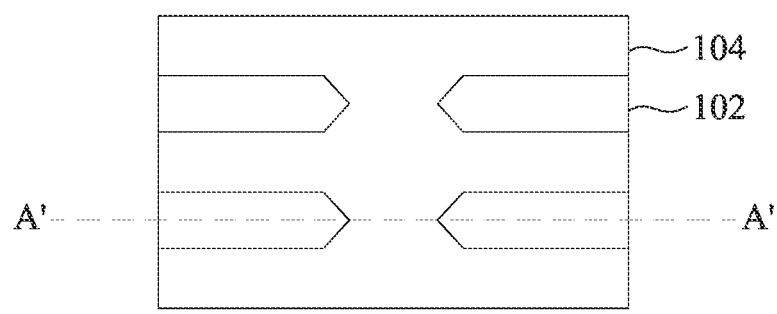
Figure 4C:
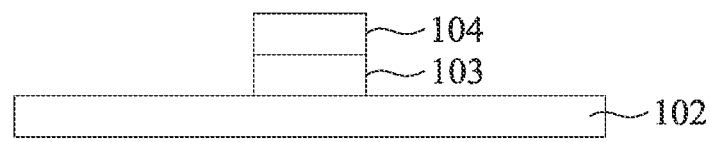

Turning to FIGS. 4A-4C, the pattern of the photoresist structure 104 is transferred to the carbon-rich hard masking layer 103 in an etching process. The etching process may be anisotropic, so that the openings in the photoresist structure 104 are extended through the carbon-rich hard masking layer 103, and have about the same sizes and shapes in the carbon-rich hard masking layer 103 as they do in the photoresist structure 104. The resulting structure is illustrated in FIGS. 4A-4C. The etching process that etches the carbon-rich hard masking layer 103 may include a wet etching process, a dry etching process, or a combination. In some embodiments, a dry etching process may be a plasma etching process including a plasma generated with a power between about 100 Watts and about 2000 Watts. The plasma etching process may be performed at a pressure between about 0.01 mTorr and about 10 mTorr and at a process temperature between about 20° C. and about 200° C. The plasma etching process may include one or more process gases such as $CF_4$, $CH_2F_2$, $CH_3F$, $CHF_3$, $Cl_2$, Ar, $O_2$, another type of process gas, or a combination. Other etching techniques may be used in other embodiments. During the etching of the carbon-rich hard masking layer 103, the target layer 102 may be at least partially consumed. After the etching of the carbon-rich hard masking layer 103, portions of the photoresist structure 104 may remain (as shown in FIGS. 4A-4C). In some embodiments, the remaining portions of the photoresist structure 104 may be removed using (as shown in Figured 5A-5C), for example, a wet etching process. In other embodiments, the remaining portions of the photoresist structure 104 are left remaining over the patterned carbon-rich hard masking layer 103, for example, to be used as a protective layer.

Figure 5A:
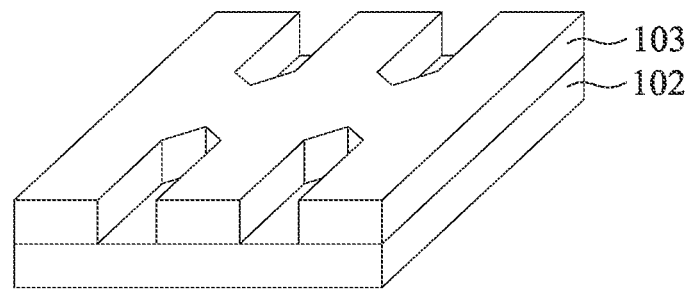
Figure 5B:
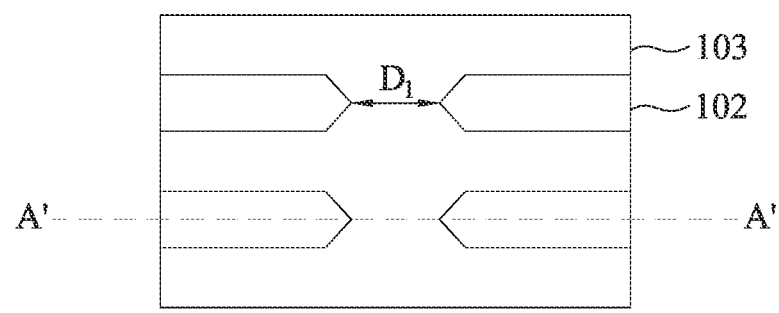
Figure 5C:
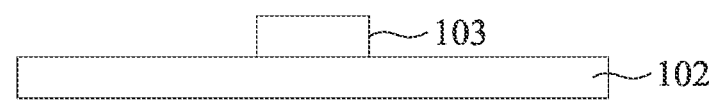

As shown in FIGS. 5A-5C, the shape of the features created by the etching process of the carbon-rich hard masking layer 103 are angled at the corners due to a localized reduction in etching efficiency from lower localized exposure to process gasses and lower localized gas flow rates during the etching process. In small scale semiconductor fabrication, starting below the 10 nm Nodes, this reduction in etching efficiency results in approximately triangular shapes at the narrow ends of patterned features in the carbon-rich hard masking layer 103.

Figure 6A:
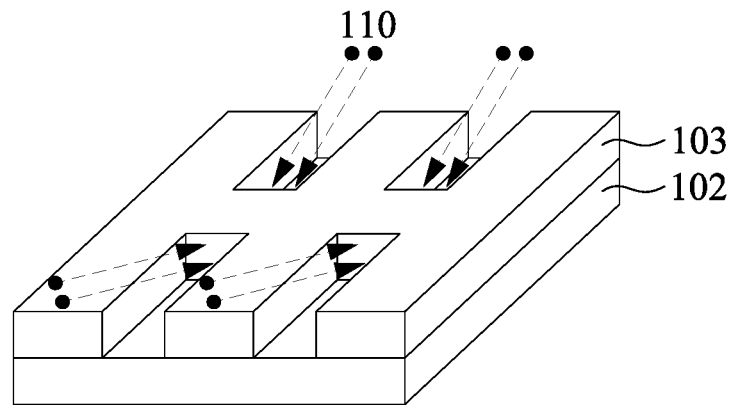
Figure 6B:
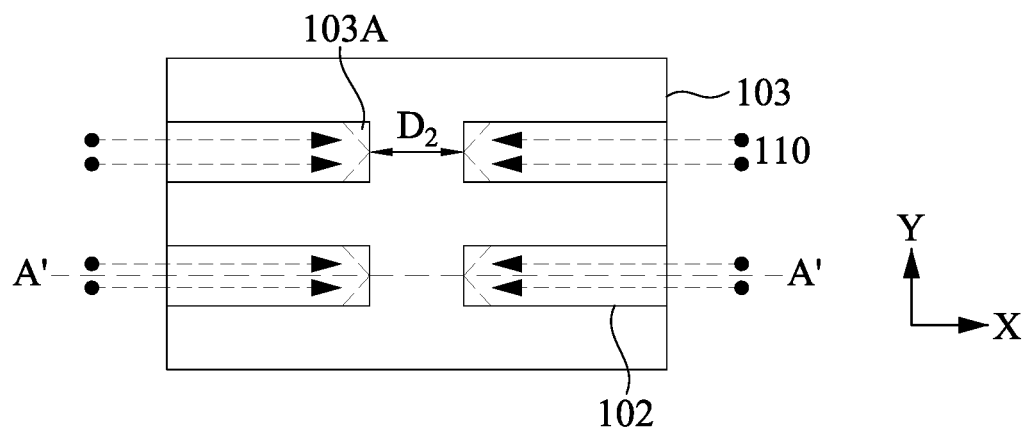
Figure 6C:
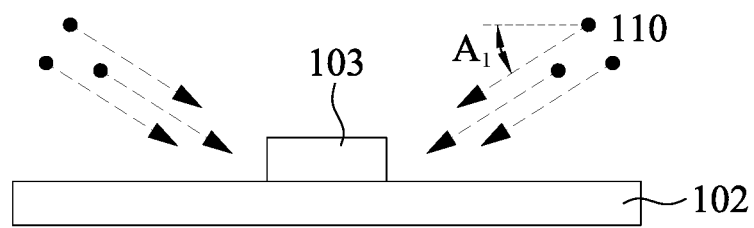

Turning to FIGS. 6A-6C, a directional ion beam trimming process 110 is performed on the carbon-rich hard masking layer 103. In some embodiments, the directional ion beam trimming process 110 includes an etching process in which ions are directed toward the semiconductor device as shown in FIG. 6B, such the narrower end walls of the patterned features in the carbon-rich hard masking layer 103 are more incident to the directional ion beam trimming process 110 than the sidewalls. In this manner, sidewalls facing a first direction (e.g., the X-axis direction in FIG. 6B) may be etched more than sidewalls facing a second direction (e.g., the Y-axis direction in FIG. 6B) that is perpendicular to the first direction. The directional ion beam trimming process 110 may be performed from a single axis direction (e.g., from left-to-right on the X-axis as shown in FIG. 6B) or from both opposite directions (e.g., from both opposite horizontal-axis directions or from both opposite Y-axis directions). In some embodiments, the directional ion beam trimming process 110 may be performed from opposite directions at the same time, and in other embodiments the directional ion beam trimming process 110 is performed in opposite directions using separate steps. In some embodiments, the directional ion beam trimming process 110 also etches top surfaces of features in addition to sidewall surfaces. The directional ion beam trimming process 110 may remove any remaining portions of the photoresist structure 104 left on the surface of the carbon-rich hard masking layer 103 prior to performing the directional ion beam trimming process 110.

In this manner, the directional ion beam trimming process 110 can trim away the angled corners 103A of the patterned features of the carbon-rich hard masking layer 103. As shown in FIG. 6B, the angled corners portion 103A of the carbon-rich hard masking layer 103, shown as dotted line portions, are removed during the directional ion beam trimming process 110, resulting in approximately rectangular end features in the carbon-rich hard masking layer 103.

In some embodiments, ions in the directional ion beam trimming process 110 are directed toward the semiconductor device at an angle $A_1$, as shown by the arrows in FIGS. 6A and 6C. In some embodiments, the angle $A_1$ is between 10 degrees and 90 degrees. By having the directional ion beam trimming process 110 performed from a Y-axis direction, the directional etching process 150 can etch sidewalls of the openings more in the Y-axis direction than in X-axis directions (as shown in FIG. 6B).

In embodiments where the carbon-rich hard masking layer 103 comprises a carbon content between 50% and 100% by atomic weight, the carbon-rich hard masking layer 103 may be hardened by the directional ion beam trimming process 110, resulting in a 10-17% etching reduction rate compared to other masking materials. This allows for a higher degree of control during the directional ion beam trimming process 110, and the ability to maintain critical dimensions within process tolerances. In some embodiments, for example, as shown in FIGS. 5B, where a smallest distance $D_1$ is needed between features to avoid line end bridge defects, the distance between features after the directional ion beam trimming process 110, $D_2$ (see FIGS. 6B and 9B) is the same as $D_1$. In other embodiments, $D_2$ is within 3 nm to 35 nm of $D_1$.

Figure 7A:
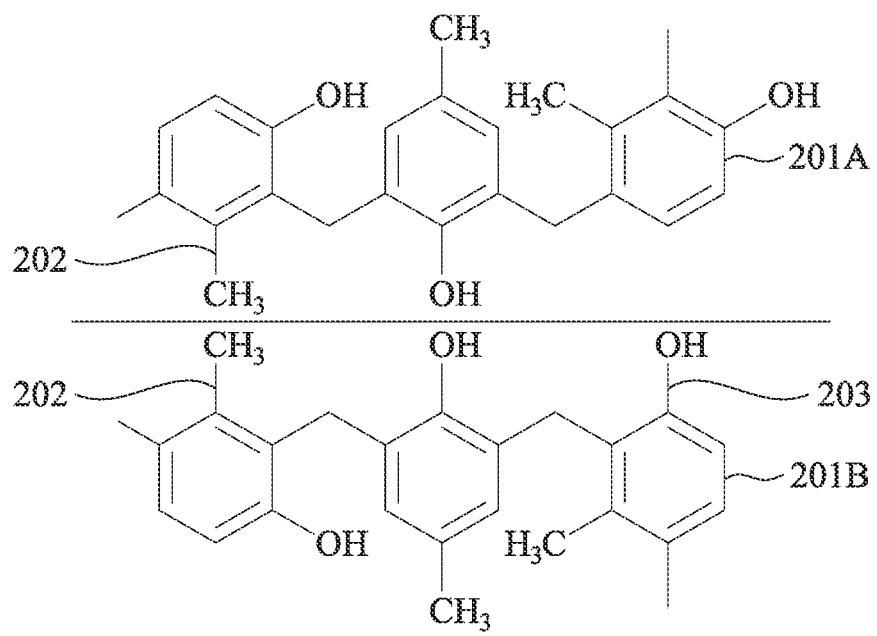
FIG. 7A-B illustrate an expected molecular change from ion beam etching of a spin on carbon layer in accordance with some embodiments.
Figure 7B:
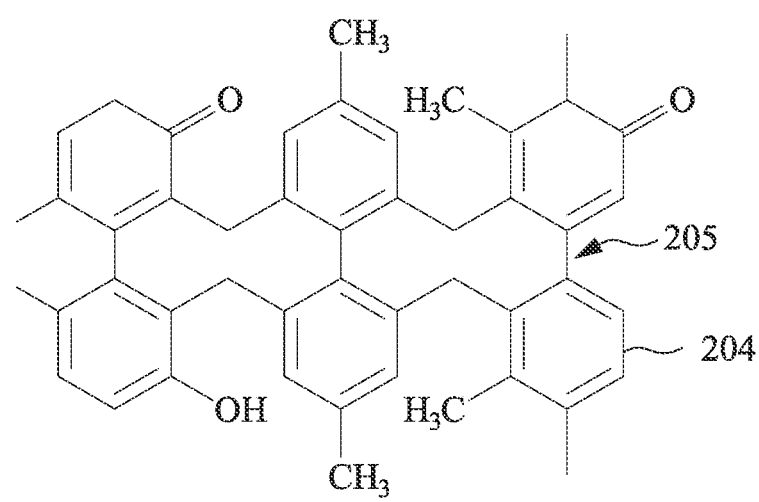

The cause of the hardening of the carbon-rich hard masking layer 103 by the directional ion beam trimming process 110 is believed to be the breaking of the carbon to hydrogen (C—H) bonds 202 and the carbon to OH (C—OH) bonds 203 in the carbon-rich hard masking layer 103 which allows formation of further carbon to carbon (C—C) bonds 205 between separate covalent carbon ring crystal lattices (201A and 201B) in the carbon-rich hard masking layer 103, resulting in a diamond-like amorphous carbon (DLC) structure 204. As shown in FIG. 7A, prior to treatment in the directional ion beam trimming process 110, the carbon-rich hard masking layer 103 exhibits a degree of C—H bonding 202 (for example, as shown by the link from the covalent carbon ring crystal lattice to the CH and $CH_3$ molecules in the top portion of FIG. 7A) and C—OH bonding 203 (for example, as shown by the link from the covalent carbon ring crystal lattice to the OH molecules in the bottom portion of FIG. 7A). During the ion bombardment of the carbon-rich hard masking layer 103 in the directional ion beam trimming process 110, energy preferentially cleaves the C—OH bond 203 and C—H bonds 202, as opposed to the carbon to carbon (C—C) bonds (between points of the six-sided covalent carbon ring crystal lattices 201A and 201B). This breaking of the C—OH bond 203 and C—H bonds 202 allows, for example, isolated covalent carbon ring crystal lattices 201A and 201B to reform into larger covalent carbon ring crystal lattices, and allows the covalent carbon ring crystal lattice to expand in size with stronger C—C bonds 205 linking the lattices together. This results in hardening of the carbon-rich hard masking layer 103 subjected to the directional ion beam trimming process 110, allowing the carbon-rich hard masking layer 103 to maintain shape during subsequent etching of the underlying target layer 102 more than traditional masking films.

Figure 8:
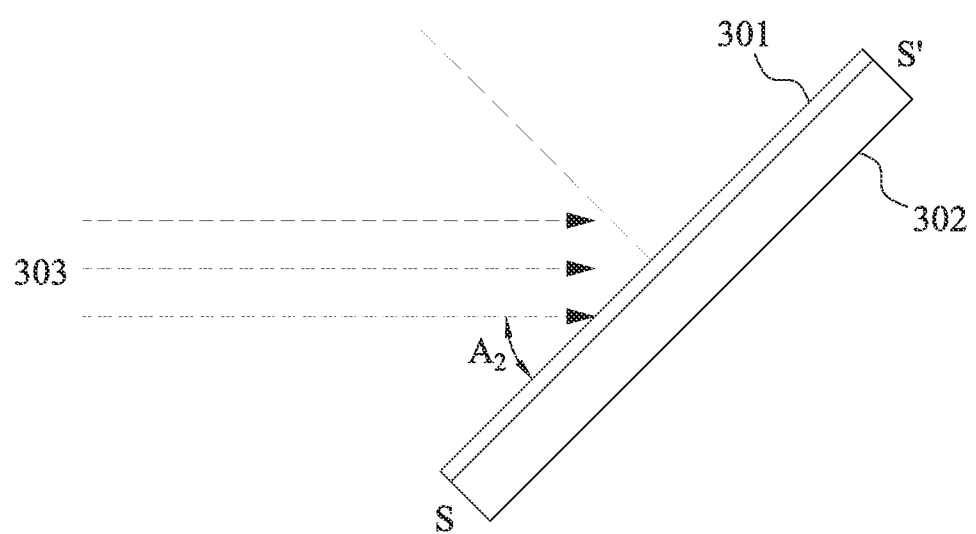
FIG. 8 illustrates a system used to perform a directional etching process in accordance with some embodiments.

In some embodiments, the directional ion beam trimming process 110 includes using an ion implanter or an ion beam etching process in which etching species of an ion are directed toward the wafer on which the target layer 102 is formed at a shallow angle, as shown by the arrows in FIG. 8. The process wafer 301 comprising the carbon-rich hard masking layer 103 and target layer 102 (see previous figures) is mounted to a fixture 302 that is configured to hold the process wafer 301 at an angle $A_2$ relative to the acceleration vector of the accelerated ions 303. The angle $A_2$ may be between about 10° and about 90°, and is the same as angle $A_1$ in FIG. 6C. The fixture 302 is also configured to rotate the process wafer 301 about an axis which is parallel to the angle $A_2$. In this manner, the fixture 302 may hold the process wafer 301 such that the ions 303 are directed toward the process wafer 301 at a shallow angle, as described previously with respect to FIGS. 6A-6C. In order to direct the ions 303 toward the process wafer 301 in opposite directions (e.g., both horizontal-axis directions), the fixture 302 may rotate the process wafer 301 180°. For example, FIG. 8 shows side S of the process wafer 301 as being closest to the incoming ions 303, corresponding to etching in one direction. To etch in the opposite direction, the fixture 302 may rotate the process wafer 301 such that the opposite side S' is closest to the incoming ions 303, corresponding to etching in the opposite direction. In this manner, the directional ion beam trimming process 110 may be performed, and variations or other embodiments of the ion etching system are considered within the scope of this disclosure.

In some embodiments, the directional ion beam trimming process 110 includes generating an ion beam with an ion energy between about 0.3 keV and 50 keV. In some embodiments, the ion dose implanted as a result of the directional ion beam trimming process 110 may be between $1 \times 10^{14}$ and $1 \times 10^{17}$ atoms per $cm^2$. In some embodiments the ion species may be carbon ions, boron ions, phosphorous ions, oxygen ions, silicon ions, argon ions, germanium ions, xenon ions, other species of ions, or combinations of these. In some embodiments the process temperature for the directional ion beam trimming process 110 may be between minus 100° C. and 500° C. In some embodiments, the pressure may be between 0.001 mTorr and 0.01 mTorr. In some embodiments, the directional ion beam trimming process 110 may be performed using a voltage bias between about 0.1 V and about 100 V.

Figure 9A:
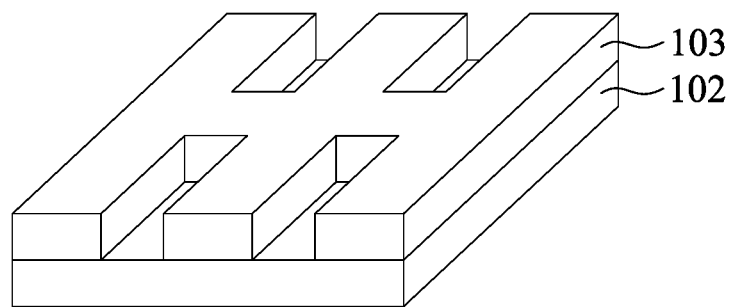
Figure 9B:
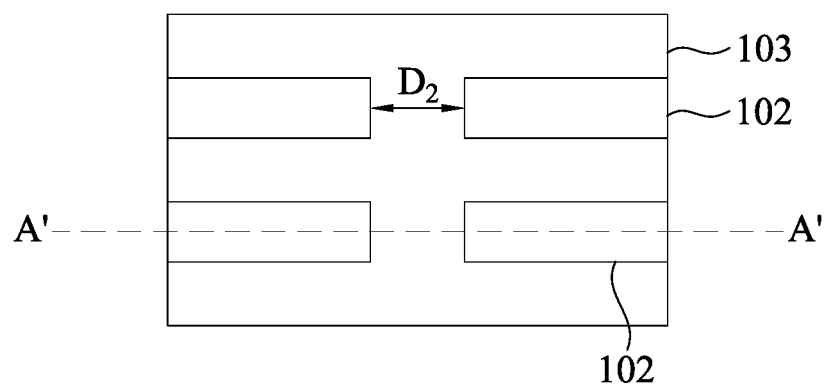
Figure 9C:
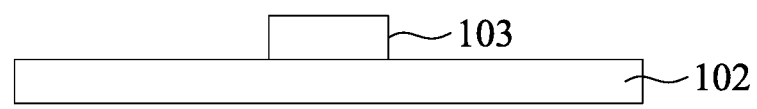

As shown in FIGS. 9A-9C, after the directional ion beam trimming process 110, the carbon-rich hard masking layer 103 exhibits patterning features that are substantially squared-off (e.g., have corners that are 90°±10°). Additionally, the carbon-rich hard masking layer 103 exhibits a 10-17% etching rate reduction in the following etching of the target layer 102 (discussed next) over traditional masking layers due to the formation of DLC discussed above.

Figure 10A:
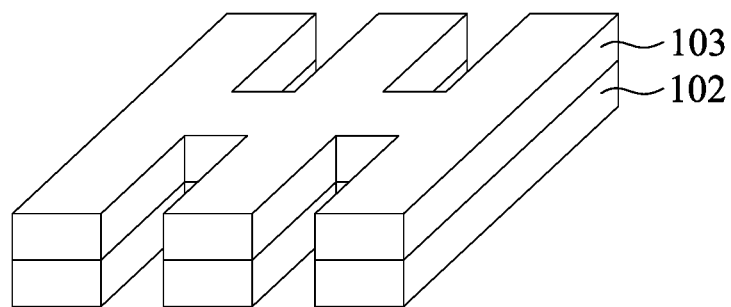
Figure 10B:
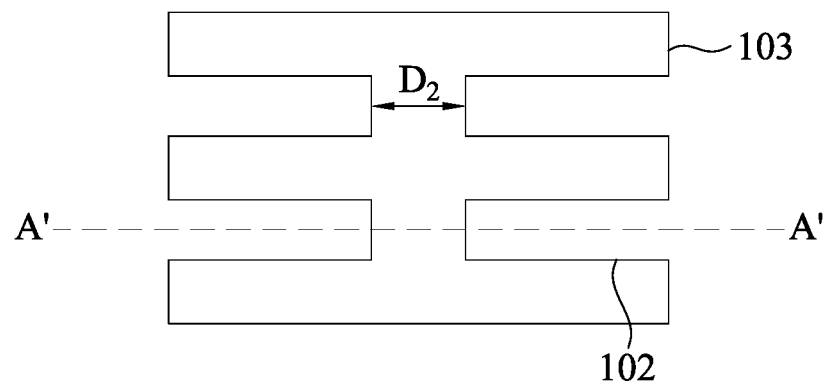
Figure 10C:
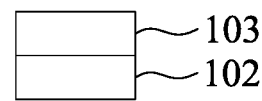

In FIG. 10A-10C, the target layer 102 is patterned using the carbon-rich hard masking layer 103 as a mask in an etching process. The etching process may be anisotropic, so that the openings in the carbon-rich hard masking layer 103 are extended target layer 102, and have about the same sizes and shapes in the target layer 102 as they do in the carbon-rich hard masking layer 103. The etching process that etches the target layer 102 may include a wet etching process, a dry etching process, or a combination. In some embodiments, a dry etching process may be a plasma etching process including a plasma generated with a power between about 100 Watts and about 2000 Watts. The plasma etching process may be performed at a pressure between about 0.01 mTorr and about 10 mTorr and at a process temperature between about 20° C. and about 200° C. The plasma etching process may include one or more process gases such as $CF_4$, $CH_2F_2$, $CH_3F$, $CHF_3$, $Cl_2$, Ar, $O_2$, another type of process gas, or a combination. Other etching techniques may be used in other embodiments. During the etching of the target layer 102, layers below the target layer 102 (if any) may be at least partially consumed. After the etching of the target layer 102, portions of the carbon-rich hard masking layer 103 may remain (as shown in FIG. 10A-10C). In some embodiments, the remaining portions of the carbon-rich hard masking layer 103 may be removed (as shown in Figured 10A-10C) using, for example, a wet etching process. In other embodiments, the remaining portions of the carbon-rich hard masking layer 103 are left remaining over the target layer 102, for example, to be used as a protective layer.

Figure 11A:
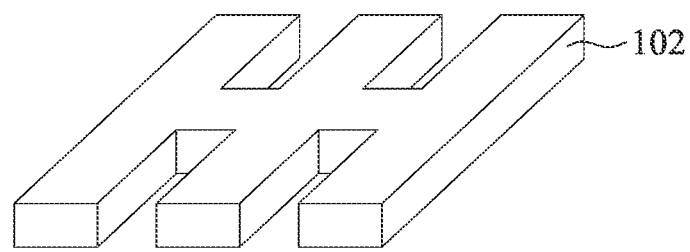
Figure 11B:
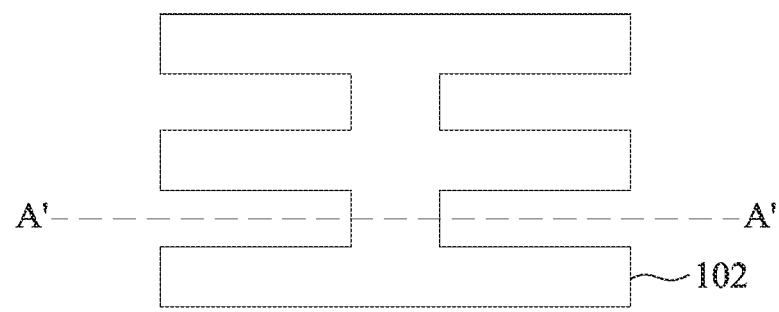

In some embodiments, as shown in FIGS. 11A and 11B, the remaining portions of the carbon-rich hard masking layer 103 may be removed using, for example, a wet etching process. In other embodiments, the remaining portions of the carbon-rich hard masking layer 103 are left remaining over the target layer 102, for example, to be used as a protective layer. The resulting features of the patterned layer inherit the substantially squared-off characteristics of the carbon-rich hard masking layer 103.

As discussed above, the target layer 102 may be used to form FinFETs, NanoFETS, or the like. For example, the target layer 102 may be used as fins for a FinFET.

Figure 12:
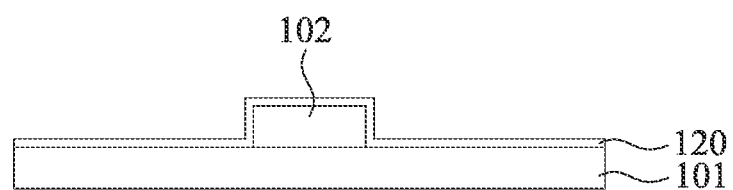
FIGS. 12-14B illustrate a plan view and cross-sectional views of the formation of conductive lines in the IMD layer in accordance with some embodiments.

FIGS. 12-14B illustrate the intermediate stages of forming metal lines within patterned openings in a target layer 102 in accordance with some embodiments. FIG. 12 illustrates further processing on the structures of FIGS. 11A-B.

Figure 13:
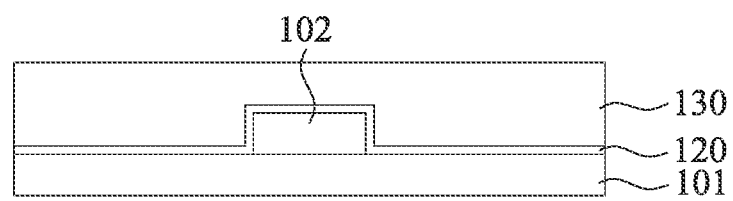

Referring to FIGS. 12-14B, conductive lines may be formed in the openings patterned in the target layer 102. In FIG. 12, one or more liners 120 may be formed along sidewalls and a bottom surface of the patterned openings. The liners 120 may include TiO, TiN, TaO, TaN, or the like, and may provide diffusion barrier, adhesion, and/or seed layers for the conductive lines. The liners 120 may be deposited using any suitable process, such as PVD, CVD, ALD, and the like. In FIG. 13, a conductive material 130 is formed over the liners 120. The conductive material 130 may be initially deposited over the liners 120 and may overfill the patterned openings, as shown in FIG. 13. The conductive material 130 may be a suitable conductive material such as copper, tungsten, aluminum, silver, gold, the like, another conductive material, or combinations thereof, and may be deposited using a process such as PVD, plating, or the like.

Figure 14A:
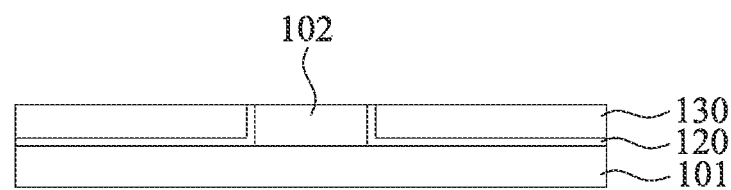
Figure 14B:
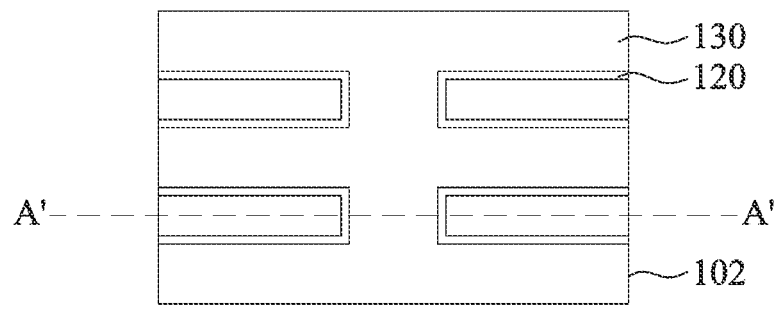

Referring to FIGS. 14A-B, a planarization process may be performed to remove excess portions of the conductive material 130 over the target layer 102. In this manner, conductive lines 130 may be formed in the target layer 102.

Embodiments may achieve advantages. For example, though the processes described above, it is possible to improve edge placement error for patterning related to process windows. Accordingly, non-uniformity and distribution of line-end critical distances can be significantly improved, up to at least a 76% reduction in instances of line-end bridge defects in some designs. Additionally, non-uniformity and distribution of line-end defects are also improved.

Further advantages based on the flexibility of the ion beam process, having multiple parameters such as energy, dose, species, tilt-angle, and temperature, allow the process to be tailored to individual semiconductor device design requirements. Additionally, the directional ion beam trimming process described above may be applied to each individual mask of a multi-layer hard mask film, providing further flexibility in the integration process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a method for forming a semiconductor device is provided including forming a target layer over a semiconductor substrate, forming a carbon-rich hard masking layer over the target layer, patterning features in the carbon-rich hard masking layer using an etching process, performing a directional ion beam trimming process on the features patterned in the carbon-rich hard masking layer, and patterning the target layer using the carbon-rich hard masking layer as a mask. In some embodiments, the directional ion beam trimming process includes reshaping an end of one or more features patterned in the carbon-rich hard masking layer from substantially triangular in shape to substantially square in shape. In some embodiments, the carbon-rich hard masking layer includes greater than 50% carbon by atomic weight. In some embodiments, the directional ion beam trimming process is performed using an ion implanter or an ion beam etching process. In some embodiments, the carbon-rich hard masking layer includes a first feature and a second feature separated by a minimum distance $D_1$ along a plane substantially parallel to the major axis of the first feature and the second feature, and the directional ion beam trimming process does not reduce the minimum distance $D_1$ separating the first feature and the second feature. In some embodiments, the directional ion beam trimming process includes generating an ion beam with an ion energy between about 0.3 keV and 50 keV. In some embodiments, an ion dose implanted as a result of the directional ion beam trimming process is between $1\times10^{14}$ and $1\times10^{17}$ atoms per $cm^2$.

In another embodiment, a method for forming a semiconductor device is provided including attaching a wafer including a carbon-rich hard masking layer, disposed over a target layer, the carbon-rich hard masking layer and target layer disposed on a semiconductor substrate, to a fixture in an ion implant device or an ion beam etching device where the carbon-rich hard masking layer is patterned to form features in the carbon-rich hard masking layer, and performing a directional ion beam trimming process on the features patterned in the carbon-rich hard masking layer where the directional ion beam trimming process further includes reshaping an end of one or more features patterned in the carbon-rich hard masking layer from substantially triangular in shape to substantially square in shape. In some embodiments, the carbon-rich hard masking layer includes greater than 50% carbon by atomic weight. In some embodiments, the carbon-rich hard masking layer includes a first feature and a second feature separated by a minimum distance $D_1$ along a plane substantially parallel to the major axis of the first feature and the second feature, and the directional ion beam trimming process does not reduce the minimum distance $D_1$ separating the first feature and the second feature. In some embodiments, the directional ion beam trimming process includes generating an ion beam with an ion energy between about 0.3 keV and 50 keV. In some embodiments, an ion dose implanted as a result of the directional ion beam trimming process is between $1\times10^{14}$ and $1\times10^{17}$ atoms per $cm^2$. In some embodiments, the directional ion beam trimming process further includes applying ion beams in a first direction relative to the carbon-rich hard masking layer, rotating the fixture on which the wafer is attached, and applying ion beams in a second direction relative to the fixture to perform directional ion beam trimming in a second direction relative to an orientation of the carbon-rich hard masking layer.

In another embodiment, a method for forming a semiconductor device is provided including forming an inter-metal dielectric (IMD) layer over a semiconductor substrate, forming a carbon-rich hard masking layer over the IMD layer, patterning features in the carbon-rich hard masking layer using an etching process, performing a directional ion beam trimming process on the features patterned in the carbon-rich hard masking layer, where the directional ion beam trimming process include reshaping an end of one or more features patterned in the carbon-rich hard masking layer from substantially triangular in shape to substantially square in shape, patterning the IMD layer using the carbon-rich hard masking layer as a mask, and forming conductive lines in the IMD layer. In some embodiments, the directional ion beam trimming process is performed using an ion implanter or an ion beam etching process. In some embodiments, the carbon-rich hard masking layer includes a first feature and a second feature separated by a minimum distance $D_1$ along a plane substantially parallel to the major axis of the first feature and the second feature, and where the directional ion beam trimming process does not reduce the minimum distance $D_1$ separating the first feature and the second feature. In some embodiments, the directional ion beam trimming process includes generating an ion beam with an ion energy between about 0.3 keV and 50 keV. In some embodiments, an ion dose implanted as a result of the directional ion beam trimming process is between $1\times10^{14}$ and $1\times10^{17}$ atoms per $cm^2$. In some embodiments, an ion species used in the direction ion beam trimming process is selected from the group including carbon ions, boron ions, phosphorous ions, oxygen ions, silicon ions, argon ions, germanium ions, and xenon ions.

What is claimed is:

1. A method for forming a semiconductor device comprising:
   forming a target layer over a semiconductor substrate;
   forming a carbon-rich hard masking layer over the target layer;
   patterning features in the carbon-rich hard masking layer using an etching process;
   performing a directional ion beam trimming process on the features patterned in the carbon-rich hard masking layer; and patterning the target layer using the carbon-rich hard masking layer as a mask.

2. The method of forming a semiconductor device of claim 1, wherein the directional ion beam trimming process further comprises reshaping an end of one or more features patterned in the carbon-rich hard masking layer from substantially triangular in shape to substantially square in shape.

3. The method of forming a semiconductor device of claim 1, wherein the carbon-rich hard masking layer comprises greater than 50% carbon by atomic weight.

4. The method of forming a semiconductor device of claim 1, wherein the directional ion beam trimming process is performed using an ion implanter or an ion beam etching process.

5. The method of forming a semiconductor device of claim 1, wherein the carbon-rich hard masking layer contains a first feature and a second feature separated by a minimum distance $D_1$ along a plane substantially parallel to the major axis of the first feature and the second feature, and wherein the directional ion beam trimming process does not reduce the minimum distance $D_1$ separating the first feature and the second feature.

6. The method of forming a semiconductor device of claim 1, wherein the directional ion beam trimming process comprises generating an ion beam with an ion energy between about 0.3 keV and 50 keV.

7. The method of forming a semiconductor device of claim 6, wherein an ion dose implanted as a result of the directional ion beam trimming process is between $1 \times 10^{14}$ and $1 \times 10^{17}$ atoms per $cm^2$.

8. The method of forming a semiconductor device of claim 6, wherein an ion species used in the direction ion beam trimming process is selected from the group comprising carbon ions, boron ions, phosphorous ions, oxygen ions, silicon ions, argon ions, germanium ions, and xenon ions.

9. A method for forming a semiconductor device comprising:
attaching a wafer comprising a carbon-rich hard masking layer, disposed over a target layer, the carbon-rich hard masking layer and target layer disposed on a semiconductor substrate, to a fixture in an ion implant device or an ion beam etching device wherein the carbon-rich hard masking layer is patterned to form features in the carbon-rich hard masking layer; and
performing a directional ion beam trimming process on the features patterned in the carbon-rich hard masking layer wherein the directional ion beam trimming process further comprises reshaping an end of one or more features patterned in the carbon-rich hard masking layer from substantially triangular in shape to substantially square in shape.

10. The method of forming a semiconductor device of claim 9, wherein the carbon-rich hard masking layer comprises greater than 50% carbon by atomic weight.

11. The method of forming a semiconductor device of claim 9, wherein the carbon-rich hard masking layer contains a first feature and a second feature separated by a minimum distance $D_1$ along a plane substantially parallel to the major axis of the first feature and the second feature, and wherein the directional ion beam trimming process does not reduce the minimum distance $D_1$ separating the first feature and the second feature.

12. The method of forming a semiconductor device of claim 9, wherein the directional ion beam trimming process comprises generating an ion beam with an ion energy between about 0.3 keV and 50 keV.

13. The method of forming a semiconductor device of claim 12, wherein an ion dose implanted as a result of the directional ion beam trimming process is between $1 \times 10^{14}$ and $1 \times 10^{17}$ atoms per $cm^2$.

14. The method of forming a semiconductor device of claim 9, wherein the directional ion beam trimming process further comprises:
applying ion beams in a first direction relative to the carbon-rich hard masking layer;
rotating the fixture on which the wafer is attached; and
applying ion beams in a second direction relative to the fixture to perform directional ion beam trimming in a second direction relative to an orientation of the carbon-rich hard masking layer.

15. A method of forming a semiconductor device comprising:
forming an inter-metal dielectric (IMD) layer over a semiconductor substrate;
forming a carbon-rich hard masking layer over the IMD layer;
patterning features in the carbon-rich hard masking layer using an etching process;
performing a directional ion beam trimming process on the features patterned in the carbon-rich hard masking layer, wherein the directional ion beam trimming process comprises reshaping an end of one or more features patterned in the carbon-rich hard masking layer from substantially triangular in shape to substantially square in shape;
patterning the IMD layer using the carbon-rich hard masking layer as a mask; and
forming conductive lines in the IMD layer.

16. The method of forming a semiconductor device of claim 15, wherein the directional ion beam trimming process is performed using an ion implanter or an ion beam etching process.

17. The method of forming a semiconductor device of claim 15, wherein the carbon-rich hard masking layer contains a first feature and a second feature separated by a minimum distance $D_1$ along a plane substantially parallel to the major axis of the first feature and the second feature, and wherein the directional ion beam trimming process does not reduce the minimum distance $D_1$ separating the first feature and the second feature.

18. The method of forming a semiconductor device of claim 15, wherein the directional ion beam trimming process comprises generating an ion beam with an ion energy between about 0.3 keV and 50 keV.

19. The method of forming a semiconductor device of claim 18, wherein an ion dose implanted as a result of the directional ion beam trimming process is between $1 \times 10^{14}$ and $1 \times 10^{17}$ atoms per $cm^2$.

20. The method of forming a semiconductor device of claim 18, wherein an ion species used in the direction ion beam trimming process is selected from the group comprising carbon ions, boron ions, phosphorous ions, oxygen ions, silicon ions, argon ions, germanium ions, and xenon ions.

* * * * *